US012630924B2

(12) United States Patent
Dezelah et al.

(10) Patent No.: US 12,630,924 B2
(45) Date of Patent: *May 19, 2026

(54) TRANSITION METAL DEPOSITION METHOD

(71) Applicant: ASM IP Holding B.V., Almere (NL)

(72) Inventors: Charles Dezelah, Helsinki (FI); Jan Maes Willem, Wilrijk (BE); Elina Färm, Helsinki (FI); Saima Ali, Helsinki (FI); Antti Niskanen, Uusimaa (FI)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/541,166

(22) Filed: Dec. 15, 2023

(65) Prior Publication Data

US 2024/0133032 A1      Apr. 25, 2024

Related U.S. Application Data

(63) Continuation of application No. 17/554,009, filed on Dec. 17, 2021, now Pat. No. 11,885,020.

(Continued)

(51) Int. Cl.
    *C23C 16/06*     (2006.01)
    *C23C 16/18*     (2006.01)
    (Continued)

(52) U.S. Cl.
    CPC ........ *C23C 16/45553* (2013.01); *C23C 16/18* (2013.01); *C23C 16/45527* (2013.01);
    (Continued)

(58) Field of Classification Search
    CPC . C23C 16/06; C23C 16/455; C23C 16/45553; C23C 16/18; C23C 16/45527
    See application file for complete search history.

(56) References Cited

U.S. PATENT DOCUMENTS

| | | |
|---|---|---|
| 6,524,952 B1 | 2/2003 | Srinivas et al. |
| 7,244,858 B2 | 7/2007 | Meiere |

(Continued)

FOREIGN PATENT DOCUMENTS

| | | | |
|---|---|---|---|
| WO | 2001029280 A1 | 4/2001 | |
| WO | 2018199642 A1 | 11/2018 | |
| WO | WO 2020/003000 A1 * | 1/2020 | ............. C23C 16/06 |

OTHER PUBLICATIONS

Klesko, Joseph P., et al., "Thermal Atomic Layer Deposition of Titanium Films Using Titanium Tetrachloride and 2 Methyl-1,4-bis(trimethylsilyl)-2,5-cyclohexadiene or 1,4-Bis(trimethylsilyl)-1,4-dihydropyrazine". Chemistry of Materials, 2015, 27, 4918-4921.*

(Continued)

*Primary Examiner* — Bret P Chen
(74) *Attorney, Agent, or Firm* — Snell & Wilmer L.L.P.

(57) ABSTRACT

Methods of depositing transition metal on a substrate. The disclosure further relates to a transition metal layer, to a structure and to a device comprising a transition metal layer. In the method, transition metal is deposited on a substrate by a cyclical deposition process, and the method comprises providing a substrate in a reaction chamber, providing a transition metal precursor to the reaction chamber in a vapor phase and providing a reactant to the reaction chamber in a vapor phase to form transition metal on the substrate. The transition metal precursor comprises a transition metal from any of groups 4 to 6, and the reactant comprises a group 14 element selected from Si, Ge or Sn.

17 Claims, 5 Drawing Sheets

Related U.S. Application Data

(60) Provisional application No. 63/129,024, filed on Dec. 22, 2020.

(51) Int. Cl.
| | |
|---|---|
| *C23C 16/455* | (2006.01) |
| *C23C 16/54* | (2006.01) |

(52) U.S. Cl.
CPC .. *C23C 16/45544* (2013.01); *C23C 16/45559* (2013.01); *C23C 16/54* (2013.01)

(56) References Cited

U.S. PATENT DOCUMENTS

| | | | | | |
|---|---|---|---|---|---|
| 7,964,505 | B2 * | 6/2011 | Khandelwal | ...... | H01L 21/76855 |
| | | | | | 257/E21.585 |
| 10,049,924 | B2 * | 8/2018 | Haukka | ............. | H01L 21/76826 |
| 10,643,904 | B2 * | 5/2020 | Xie | ....................... | H10D 84/038 |
| 10,714,350 | B2 * | 7/2020 | Chen | ................ | C23C 16/45531 |
| 10,847,366 | B2 * | 11/2020 | Mattinen | ................ | H10D 99/00 |
| 11,885,020 | B2 * | 1/2024 | Dezelah | .................. | C23C 16/54 |
| 2003/0190424 | A1 | 10/2003 | Sneh | | |
| 2005/0059241 | A1 | 3/2005 | Kori et al. | | |
| 2005/0215805 | A1 | 9/2005 | Meiere | | |
| 2008/0102204 | A1 * | 5/2008 | Elers | ....................... | C23C 16/32 |
| | | | | | 427/249.1 |
| 2008/0102205 | A1 | 5/2008 | Barry et al. | | |
| 2009/0053893 | A1 * | 2/2009 | Khandelwal | ...... | H01L 21/28562 |
| | | | | | 257/E21.17 |
| 2011/0293830 | A1 * | 12/2011 | Hatanpaa | ............... | C01G 23/07 |
| | | | | | 427/255.7 |
| 2015/0140776 | A1 * | 5/2015 | Yasuda | .............. | H10N 70/8833 |
| | | | | | 438/382 |
| 2018/0122642 | A1 * | 5/2018 | Raisanen | ............. | H10D 84/038 |
| 2018/0122709 | A1 * | 5/2018 | Xie | .................... | H10D 84/0181 |
| 2019/0249300 | A1 * | 8/2019 | Hatanpää et al. | ........................... | |
| | | | | | C23C 16/45527 |
| 2019/0368039 | A1 * | 12/2019 | Arteaga | .................. | C07F 11/00 |
| 2020/0115798 | A1 * | 4/2020 | Wright, Jr. | ........ | H01L 21/28556 |
| 2020/0232096 | A1 * | 7/2020 | Hatanpää et al. | ...... | C23C 16/34 |
| 2024/0096632 | A1 * | 3/2024 | Färm | ....................... | C23C 16/16 |

OTHER PUBLICATIONS

Zhang, Xingyu, et al., "Atomic layer deposition of Ti and its deposition method". IOP Conf. Series: Materials Science and Engineering 772 (2020) 012018, pp. 1-8.*

Tarre, Aivar, et al., "Atomic layer deposition of Cr2O3 thin films: Effect of crystallization on growth and properties". Applied Surface Science 254 (2008) 5149-5156.*

Boukhalfa, Sofiane, et al., "Atomic layer deposition of vanadium oxide on carbon nanotubes for high-power supercapacitor electrodes". Energy & Environmental Science, 2012, 5, 6872-6879.*

Lim, Booyong S., et al., "Atomic layer deposition of transition metals". Nature Materials, vol.2, Nov. 2003, pp. 749-754.*

Knisley, Thomas J., et al., "Precursors and chemistry for the atomic layer deposition of metallic first row transition metal films". Coordination Chemistry Reviews 257 (2013) 3222-3231.*

Shenai, Deo V., et al., "Safer alternative liquid germanium precursors for relaxed graded SiGe layers and strained silicon by MOVPE", Journal of Crystal Growth, vol. 298, Jan. 2007, pp. 172-175.*

* cited by examiner

100

100

A

B

C

D

900

TRANSITION METAL DEPOSITION METHOD

CROSS-REFERENCE TO RELATED APPLICATIONS

This application is a continuation of, and claims priority to, U.S. patent application Ser. No. 17/554,009 filed Dec. 17, 2021, now U.S. Pat. No. 11,885,020, issued Jan. 30, 2024, and titled TRANSITION METAL DEPOSITION METHOD, which claims the benefit of U.S. Provisional Patent Application Ser. No. 63/129,024 filed Dec. 22, 2020 and titled TRANSITION METAL DEPOSITION METHOD, the disclosures of which are hereby incorporated by reference in their entirety.

FIELD

The present disclosure relates to methods and apparatuses for the manufacture of semiconductor devices. More particularly, the disclosure relates to methods and systems for depositing transition metal on a substrate, and layers comprising transition metal.

BACKGROUND

Semiconductor device fabrication processes generally use advanced deposition methods for forming metal and metal-containing layers with specific properties. Transition metals in groups 4 (titanium, zirconium, hafnium), 5 (vanadium, niobium, tantalum) and 6 (chromium, molybdenum and tungsten) may have many of the advantages sought in the art. For example, they may be useful as a conductor material in back end of line (BEOL) or mid end of line (MEOL) applications, or in buried power rail or in work function layer in logic applications and in word or bit line in advanced memory applications. Additionally, they may be used in metal gate applications.

The deposition of high quality metallic thin films by atomic layer deposition remains challenging, especially for electropositive elements, and for metals that readily form nitride or carbide phases. Electropositive elements are difficult to reduce to the elemental form, often requiring powerful reducing agents, unusual conditions, or plasma-based approaches. Some metallic elements, especially those from groups 4, 5, and 6, often incorporate carbon or nitrogen from either the metal precursor ligands or from the co-reactants used in deposition to generate a metal carbide or metal nitride. Avoiding ligands and co-reactants containing carbon and nitrogen is difficult, and severely limits the selection of possible chemistry. Thus there is need in the art for alternative or improved methods for depositing transition metals or transition metal-containing layers.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of depositing transition metal.

In the current disclosure, methods of depositing transition metal on a substrate by a cyclical deposition process are disclosed. The methods comprise providing a substrate in a reaction chamber, providing a transition metal precursor to the reaction chamber in a vapor phase and providing a reactant to the reaction chamber in a vapor phase to form transition metal on the substrate. The transition metal precursor according to the current disclosure comprises a transition metal from any of groups 4 to 6, and the reactant comprises a group 14 element selected from Si, Ge or Sn.

The current disclosure further relates to a transition metal layer produced by the method according to the current disclosure. Thus, a substrate is provided in a reaction chamber, a transition metal precursor comprising a transition metal from any of groups 4 to 6 is provided the reaction chamber in a vapor phase, and a reactant comprising a group 14 element selected from Si, Ge or Sn is provided to the reaction chamber to form transition metal on the substrate.

In an additional aspect, the current disclosure relates to a structure comprising transition metal deposited by a method according to the current disclosure. The transition metal comprised in the structure may be deposited as a layer. In other words, it may be a transition metal layer. As used herein, a "structure" can be or include a substrate as described herein. Structures can include one or more layers overlying the substrate, such as one or more layers formed by a method according to the current disclosure. The structure may be, for example, a via or a line in BEOL, or a contact or a local interconnect in MEOL. The structure may also be a work function layer in a gate electrode, or a buried power rail in logic applications, as well as a word line or a bit line in an advanced memory application.

In yet another aspect, the current disclosure relates to a semiconductor device comprising transition metal deposited by a method according to the current disclosure. The device may be, for example, a gate electrode, a logic or a memory device.

In a further aspect, a deposition assembly is disclosed. The deposition assembly is constructed and arranged to deposit transition metal on a substrate. The deposition assembly for depositing transition metal on a substrate according to the current disclosure comprises one or more reaction chambers constructed and arranged to hold the substrate, and a precursor injector system constructed and arranged to provide a transition metal precursor and/or a reactant into the reaction chamber in a vapor phase. The deposition assembly further comprises a precursor vessel constructed and arranged to contain a transition metal precursor comprising a transition metal from any of groups 4 to 6 and a reactant vessel constructed and arranged to contain a reactant comprising a group 14 element selected from Si, Ge or Sn. The deposition assembly is constructed and arranged to provide the transition metal precursor and/or the reactant via the precursor injector system to the reaction chamber to deposit transition metal on the substrate. In an assembly according to the current disclosure, a transition metal precursor and/or a reactant may be evaporated with a direct liquid injector. In such embodiments, then precursor and or reactant liquid is pumped from the vessel and directly injected in a flow of carrier gas.

The following abbreviations shall be used throughout this disclosure: Me stands for methyl ($CH_3$) and Et for ethyl ($C_2H_5$). nPr or Pr stands for n-propyl, iPr for isopropyl, nBu or Bu for n-butyl, tBu for Cert-butyl, sBu for sec-butyl, nPn or Pn for n-pentyl and tPn for tert-pentyl. Bz stands for bezene and Cp for cyclopentadienyl, In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings

DETAILED DESCRIPTION

Figure 1A:
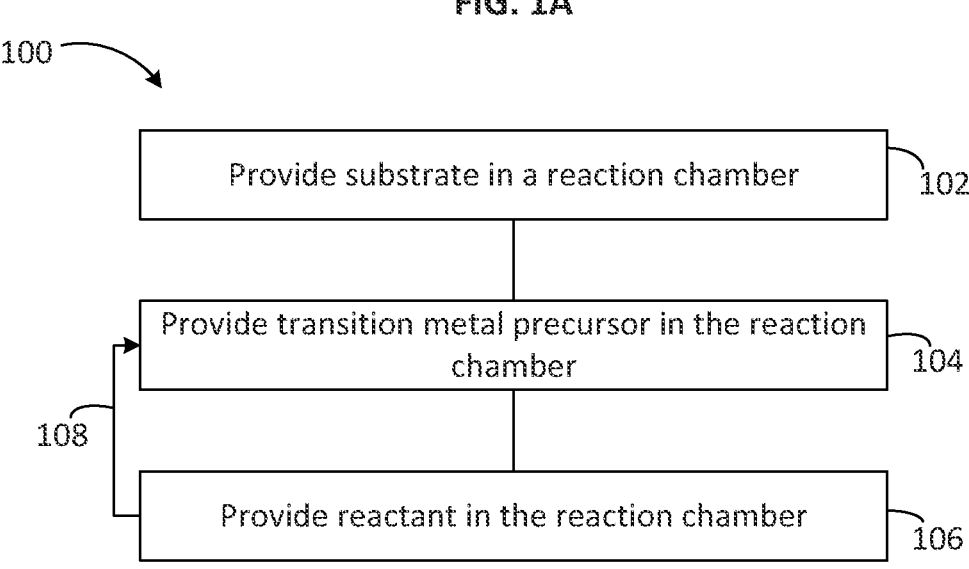
FIGS. 1A and 1B illustrate two exemplary embodiments of a method according to the current disclosure.

The description of exemplary embodiments of methods, structures, devices and apparatuses provided below is merely exemplary and is intended for purposes of illustration only. The following description is not intended to limit the scope of the disclosure or the claims. Moreover, recitation of multiple embodiments having indicated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

The current disclosure relates to a method of depositing transition metal on a substrate. The method comprises providing a substrate in a reaction chamber, providing a transition metal precursor in the reaction chamber in vapor phase and providing a reactant to the reaction chamber in a vapor phase to form transition metal on the substrate. In the current disclosure, transition metal may be deposited predominantly, or in some embodiments substantially completely or completely, as an elemental metal. By elemental, transition metal is herein meant transition metal with an oxidation state of zero. A transition metal deposited according to the current disclosure may have partly an oxidation state of 0, +2, +3, +4, +5 and/or +6. In some embodiments, at least 60% of transition metal is deposited as elemental metal. In some embodiments, at least 80% or at least 90% of transition metal is deposited as elemental metal. In some embodiments, at least 93% or 95% of transition metal is deposited as elemental metal.

Transition Metal Precursor

The terms "precursor" and "reactant" can refer to molecules (compounds or molecules comprising a single element) that participate in a chemical reaction that produces another compound. A precursor typically contains portions that are at least partly incorporated into the compound or element resulting from the chemical reaction in question. Such a resulting compound or element may be deposited on a substrate. A reactant may me an element or a compound that is not incorporated into the resulting compound or element to a significant extent. However, a reactant may also contribute to the resulting compound or element in certain embodiments.

As used herein, "a transition metal precursor" includes a gas or a material that can become gaseous and that can be represented by a chemical formula that includes transition metal selected from groups 4 (titanium, zirconium, hafnium), 5 (vanadium, niobium, tantalum) or 6 (chromium, molybdenum and tungsten) of the periodic table of elements.

In some embodiments, the transition metal precursor comprises a group 4 transition metal. The transition metal precursor may thus comprise titanium (Ti). The transition metal precursor may alternatively comprise zirconium (Zr). As another alternative, the transition metal precursor may comprise hafnium (Hf). In some embodiments, the transition metal in the transition metal precursor is selected from a group consisting of titanium, zirconium and hafnium. In some embodiments, the transition metal in the transition metal precursor is selected from a group consisting of titanium and hafnium.

In some embodiments, the transition metal precursor comprises a group 5 transition metal. The transition metal precursor may thus comprise vanadium (V), or the transition metal precursor may comprise niobium (Nb), or the transition metal precursor may comprise tantalum (Ta). In some embodiments, the transition metal in the transition metal precursor is selected from a group consisting of vanadium, niobium and tantalum. In some embodiments, the transition metal in the transition metal precursor is selected from a group consisting of vanadium and tantalum.

In some embodiments, the transition metal precursor comprises a group 6 transition metal. The transition metal precursor may comprise chromium (Cr). Alternatively, the transition metal precursor may comprise molybdenum (Mo). The transition metal precursor may comprise tungsten (W). In some embodiments, the transition metal in the transition metal precursor is selected from a group consisting of chromium, molybdenum and tungsten. In some embodiments, the transition metal in the transition metal precursor is selected from a group consisting of molybdenum and tungsten.

In some embodiments, transition metal precursor is provided in a mixture of two or more compounds. In a mixture, the other compounds in addition to the transition metal precursor may be inert compounds or elements. In some embodiments, transition metal precursor is provided in a composition. Compositions suitable for use as composition can include a transition metal compound and an effective amount of one or more stabilizing agents. Composition may be a solution or a gas in standard conditions.

In some embodiments, transition metal precursor comprises a transition metal atom and an organic ligand. In some embodiments, transition metal precursor comprises a metal-organic precursor comprising a transition metal according to the current disclosure. Thus, the transition metal precursor is a metal-organic precursor. By a metal-organic precursor is herein meant a transition metal precursor comprising a metal, such as a group 4-6 transition metal according to the current disclosure, and an organic ligand, wherein a metal atom is not directly bonded to a carbon atom. In some embodiments, a metal-organic precursor comprises one transition metal atom, which is not directly bonded with a carbon atom. In some embodiments, a metal-organic precursor comprises two or more transition metal atoms, none of which is directly bonded to a carbon atom. In some embodiments, a metal-organic precursor comprises two or more transition metal atoms, wherein at least one transition metal atom is not directly bonded to a carbon atom.

In some embodiments, transition metal precursor comprises an organometallic compound comprising a transition metal according to the current disclosure. Thus, the transition metal precursor is an organometallic precursor. By an organometallic precursor is herein meant a transition metal precursor comprising a transition metal, such as a group 4-6 transition metal according to the current disclosure, and an organic ligand, wherein the transition metal atom is directly bonded to a carbon atom. In embodiments in which an organometallic precursor comprises two or more transition metal atoms, all of the metal atoms are directly bonded with a carbon atom.

In some embodiments, the transition metal precursor comprises only a transition metal atom according to the current disclosure, carbon and hydrogen. In other words, transition metal precursor does not contain oxygen, nitrogen or other additional elements. However, in some embodiments, the metal-organic or organometallic precursor comprises a transition metal according to the current disclosure, carbon, hydrogen and at least one additional element. The additional element may be, for example, oxygen, nitrogen or a halogen. In some embodiments, the additional element is not directly bonded to the metal. Thus, in some embodiments, a transition metal precursor does not contain a metal-nitrogen bond. In some embodiments, a transition metal precursor does not contain a metal-oxygen bond. In some embodiments, a transition metal precursor does not contain a metal-halogen bond. The at least one additional element in a metal-organic or organometallic precursor may be a ligand. The at least one additional element may thus be an additional ligand. In some embodiments, the metal-organic or organometallic precursor comprises an additional ligand, and the ligand is a halide. In some embodiments, the metal-organic or organometallic precursor may comprise at least two additional ligands, and one or two of the additional ligands may be a halide. Each of the additional ligands may be independently selected. A halide may be selected from the group consisting of chloro, bromo and iodo. Thus a ligand may be a halogen atom, selected from the group consisting of chlorine, bromine and iodine.

In some embodiments, transition metal precursor comprises at least two organic ligands. In some embodiments, transition metal precursor comprises at least three organic ligands. In some embodiments, transition metal precursor comprises four organic ligands. In some embodiments, transition metal precursor comprises a organic ligand and a hydride ligand. In some embodiments, transition metal precursor comprises a organic ligand and two or more hydride ligands. In some embodiments, transition metal precursor comprises two organic ligands and two hydride ligands. In some embodiments, one or more of the organic ligands is a hydrocarbon ligand.

In some embodiments, transition metal precursor comprises cyclic portions. For example, the transition metal precursor may comprise a benzene or a cyclopentadienyl ring. The transition metal precursor may comprise one or more benzene rings. In some embodiments, the transition metal precursor comprises two benzene rings. One or both benzene rings may comprise hydrocarbon substituents. In some embodiments, each benzene ring of the transition metal precursor comprises an alkyl substituent. An alkyl substituent may be a methyl group, an ethyl group, or a linear or branched alkyl group comprising three, four, five or six carbon atoms. For example, the alkyl substituent of the benzene ring (Bz) may be an n-propyl group or an iso-propyl group. Further, the alkyl substituent may be an n-, iso-, tert- or sec-form of a butyl, pentyl or hexyl moiety. In some embodiments, the transition metal precursor comprises, consist essentially of, or consist of bis(ethylbenzene)transition metal. In some embodiments, a transition metal precursor comprises, consist essentially of, or consist of, $V(Bz)_2$, $MoBz_2$, $CrBz_2$, $WBz_2$, $V(EtBz)_2$, $Mo(EtBz)_2$, $Cr(EtBz)_2$, or $W(EtBz)_2$.

The transition metal precursor may comprise one or more cyclopentadienyl groups. In some embodiments, the transition metal precursor comprises two cyclopentadienyl groups. A cyclopentadienyl group may be similarly substituted as a benzene group. In other words, one or more of the cyclopentadienyl groups may comprise hydrocarbon substituents. In some embodiments, one or both of the cyclopentadienyl groups has an alkyl substituent, such as a methyl group, an ethyl group, or a linear or branched alkyl group comprising three, four, five or six carbon atoms. For example, the alkyl substituent of the cyclopentadienyl group may be an n-propyl group, an iso-propyl group. Further, the alkyl substituent may be an n-, iso-, tert- or sec-form of a butyl, pentyl or hexyl moiety.

Some examples of transition metal precursors according to the current disclosure comprising a cyclopentadienyl moiety are $TiCp_2Cl_2$, $TiCp_2Br_2$, $TiCp_2$, $TiCp_2(CO)_2$, $TiCp_2I_2$, $TiCp_2H_2$, $TiCpCl_3$, $TiCpBr_3$, $TiCpI_3$, $HfCp_2Cl_2$, $HfCp_2Br_2$, $HfCp_2$, $HfCp_2(CO)_2$, $HfCp_2I_2$, $HfCp_2H_2$, $HfCpCl_3$, $HfCpBr_3$, $HfCpI_3$, $ZrCp_2Cl_2$, $ZrCp_2Br_2$, $ZrCp_2$, $ZrCp_2(CO)_2$, $ZrCp_2I_2$, $ZrCp_2H_2$, $ZrCpCl_3$, $ZrCpBr_3$, $ZrCpI_3$, $VCp_2Cl_2$, $VCp_2Br_2$, $VCp_2I_2$, $VCp_2$, $VCp_2(CO)_4$, $TaCp_2Cl_2$, $TaCp_2I_2$, $TaCp_2Br_2$, $TaCp_2H_2$, $NbCp_2$, $NbCp_2H_2$, $NbCp_2Cl_2$, $MoCp_2Cl_2$, $MoCp_2H_2$, $CrCp_2H_2$, $CrCp_2$, $CrCp_2Cl_2$, $WCp_2H_2$, $WCp_2Cl_2$, $WCp_2Br_2$ and $WCp_2I_2$.

Some further examples of cyclopentadienyl-containing transition metal precursors are $Ti(iPrCp)_2Cl_2$, $Ti(iPrCp)_2$, $Ti(MeCp)_2Cl_2$, $Ti(MeCp)_2$, $Ti(EtCp)_2Cl_2$, $Ti(EtCp)_2$, $Hf(iPrCp)_2Cl_2$, $Hf(iPrCp)_2$, $Hf(MeCp)_2Cl_2$, $Hf(MeCp)_2$, $Hf(EtCp)_2Cl_2$, $Hf(EtCp)_2$, $Zr(iPrCp)_2Cl_2$, $Zr(iPrCp)_2$, $Zr(MeCp)_2Cl_2$, $Zr(MeCp)_2$, $Zr(EtCp)_2Cl_2$, $Zr(EtCp)_2$, $V(iPrCp)_2Cl_2$, $V(iPrCp)_2$, $V(MeCp)_2Cl_2$, $V(MeCp)_2$, $V(EtCp)_2Cl_2$, $V(EtCp)_2$, $Mo(iPrCp)_2Cl_2$, $Mo(iPrCp)_2H_2$, $Mo(EtCp)_2H_2$, $Cr(MeCp)_2$, $Cr(EtCp)_2$, $Cr(iPrCp)_2$, Cr(tBuCp)$_2$, Cr(nBuCp)$_2$, Cr(Me,Cp)$_2$, Cr(Me$_4$Cp)$_2$, W(EtCp)$_2$H$_2$, W(iPrCp)$_2$Cl$_2$ and W(iPrCp)$_2$H$_2$.

In some embodiments, the transition metal precursor may comprise a carbonyl group-containing ligand. For example, the transition metal precursor may comprise, consist essentially of, or consist of Mo(CO)$_6$, Mo(1,3,5-cycloheptatriene)(CO)$_3$. Additionally, in some embodiments, the transition metal precursor comprises a nitrosyl group-containing ligand. For example, the molybdenum precursor may comprise, consist essentially of, or consist of MoCp(CO)$_2$(NO).

Reactant

In a method according to the current disclosure, reactant comprises a group 14 element selected from silicon (Si), germanium (Ge) or tin (Sn). In some embodiments, the reactant comprises a group 14 element selected from a group consisting of Si and Ge. In some embodiments, the reactant comprises a group 14 element selected from a group consisting of Si and Sn. In some embodiments, the reactant comprises a group 14 element selected from a group consisting of Ge and Sn.

In some embodiments, a reactant comprises one atom of a group 14 element according to the current disclosure. In some embodiments, a reactant comprises two atoms of a group 14 element according to the current disclosure. The two or more atoms of group 14 element may be the same or a different element. For example, the reactant may contain two Si atoms, two Ge atoms or two Sn atoms. Alternatively, the reactant may comprise a Si atom and a Ge atom, a Si atom and a Sn atom or a Sn atom and a Ge atom. In some embodiments, a reactant comprises two atoms of a group 14 element according to the current disclosure bonded to each other.

In some embodiments, a reactant comprises two atoms of a group 14 element according to the current disclosure bonded to each other, and each atom of the group 14 element has a halogen atom attached to it. The halogen may be, for example, Cl, F or I. In some embodiments, a reactant comprises two atoms of a group 14 element according to the current disclosure bonded to each other, and each atom of the group 14 element has a an alkyl group attached to it. For example, the alkyl group may be a methyl, ethyl, propyl, butyl or pentyl.

In some embodiments, a reactant comprises a Si—Si bond. In some embodiments, a reactant comprises a Ge—Ge bond. In some embodiments, a reactant comprises a Sn—Sn bond. In some embodiments, a reactant comprises a Si—Si bond with a halogen atom attached to each Si atom. In some embodiments, a reactant comprises a Ge—Ge bond with a halogen atom attached to each Ge atom. In some embodiments, a reactant comprises a Sn—Sn bond with a halogen atom attached to each Ge atom.

The reactant may comprise an organic group. An organic group is a group containing a carbon-hydrogen bond. Thus, the reactant comprises a group 14 element selected from a group consisting of Si, Ge and Sn, and an organic group. The reactant may comprise a hydrocarbon containing at least one carbon atom. There may be one, two, three or four organic groups in a reactant. Each organic group may independently contain 1 to 12 carbon atoms. For example, each organic group may independently comprise a C1 to C4 group (i.e. contain from one to four carbon atoms), a C1 to C6 group, a C1 to C8 group, a C1-C10 group, a C2 to C12 group, a C2 to C6 group, a C2 to C6 group, or a C4 to C8 group or a C4 to C10 group. Therefore, each organic group may independently comprise a Cl, C2, C3, C4, C5, C6, C7, C8 or a C10 group. An organic group may comprise an alkyl or an aryl. An organic group may comprise on or more linear, branched or cyclical alkyl. In some embodiments, an organic group comprises an aryl group. An alkyl or an aryl group may be substituted with one or more functional groups, such as a halogen, alcohol, amine or benzene.

For example, the organic group may comprise a halogenated methane, ethane, propane, 2-methylpropane, 2,2-dimethylpropane (neopentane), n-butane, 2-methylbutane, 2,2-dimethylbutane, n-pentane, 2-methylpantane, 3-methylpentane or an n-hexane. In some embodiments, the reactant comprises two halogen atoms. In some further embodiments, the at least two halogen atoms of the reactant may be attached to different carbon atoms. The halogen atoms may be the same halogen, for example bromine, iodine, fluorine or chlorine. Alternatively, the halogens may be different halogens, such as iodine and bromine, bromine and chlorine, chlorine and iodine. In some embodiments, the reactant comprises 1,2-dihaloalkane or 1,2-dihaloalkene or 1,2-dihaloalkyne or 1,2-dihaloarene, where the halogens are attached to adjacent carbon atoms.

In some embodiments, a reactant has a general formula R$_a$MX$_b$ or R$_c$X$_d$M-MR$_c$X$_d$. In the formula, a is 0, 1, 2 or 3, b is 4-a, c is 0, 1 or 2, d is 3-c, R is an organic group as described above, M is Si, Ge or Sn, and each X is independently any ligand. R may be a hydrocarbon. If a is two or three, or c is two, each R is selected independently. In some embodiments, each R is selected from alkyls and aryls. In some embodiments, R is an organic group as described above. In some embodiments, R is alkyl or an aryl. For clarity, X may represent different ligands in one reactant species. Thus, in some embodiments, a reactant may be, for example SiH$_2$Br$_2$, SiH$_2$I$_2$ or SiH$_2$Cl$_2$.

In some embodiments, a reactant has a more specific formula R$_a$SiX$_b$. More specifically, a reactant may have a formula R$_3$SiX, R$_2$SiX$_2$, RSiX$_3$, or SiX$_4$. However, in some embodiments, a silicon atom does not comprise four identical substituents. In some embodiments, the reactant is not SiH$_4$. In some embodiments, the reactant is not SiH$_2$Me$_2$. In some embodiments, a reactant is not SiH$_2$Et$_2$. In some embodiments, reactant is not Si$_2$H$_2$.

In some embodiments, a reactant has a more specific formula R$_a$GeX$_b$. More specifically, a reactant may have a formula R$_3$GeX, R$_2$GeX$_2$, RGeX$_3$, or GeX$_4$. However, in some embodiments, a Ge atom does not comprise four identical substituents. In some embodiments, the reactant is not GeH$_4$.

In some embodiments, a reactant has a more specific formula R$_a$SnX$_b$. More specifically, a reactant may have a formula R$_3$SnX, R$_2$SnX$_2$, RSnX$_3$, or SnX$_4$. However, in some embodiments, a tin atom does not comprise four identical substituents. In some embodiments, the reactant is not SnH$_4$.

In some embodiments, X is hydrogen, a substituted or an unsubstituted alkyl or aryl or a halogen. In some embodiments, X is H. In some embodiments, X is an alkyl or an aryl. In some embodiments, X is a C1 to C4 alkyl. In some embodiments, X is a substituted alkyl or aryl. In some embodiments, X is a substituted alkyl or aryl, wherein the substituent is same as M. In some embodiments, X is selected from a group consisting of H, Me, Et, nPr, iPr, nBu, tBu, M'Me$_3$, M'Et$_3$, M'Pr$_3$, M'Bu$_3$, Cl, Br, or I, wherein M' is same as M. Thus, in such embodiments, for reactants of formula R$_a$SiX$_b$, M' is Si, for reactants of formula R$_a$GeX$_b$, M' is Ge, and for reactants of formula R$_a$SnX$_b$, M' is Sn.

In some embodiments, transition metal is deposited on a substrate as a layer. In some embodiments, transition metal forms a transition metal layer. As used herein, a "transition metal layer" can be a material layer that contains transition metal. As used herein, the term "layer" and/or "film" can refer to any continuous or non-continuous structure and material, such as material deposited by the methods disclosed herein. For example, layer and/or film can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. A seed layer may be a non-continuous layer serving to increase the rate of nucleation of another material. However, the seed layer may also be substantially or completely continuous.

Without limiting the current disclosure to any specific theory, in some embodiments it may be possible to produce transition metal layers with low resistivity. The resistivity of a transition metal layer according to the current disclosure may be from about 5 uOhm cm to about 300 $\mu\Omega$ cm or from about 5 $\mu\Omega$ cm to about 100 $\mu\Omega$ cm, or from about 5 $\mu\Omega$ cm to about 50 $\mu\Omega$ cm such as about 10 $\mu\Omega$ cm, 15 $\mu\Omega$ cm, 20 $\mu\Omega$ cm or 30 $\mu\Omega$ cm. In other embodiments, the resistivity of a transition metal layer may be about 50 $\mu\Omega$ cm, 100 $\mu\Omega$ cm, 150 $\mu\Omega$ cm or 200 $\mu\Omega$ cm.

The transition metal may be at least partly in elemental form. Thus, the oxidation state of transition metal may be zero. A transition metal layer can include additional elements, such as nitrogen, carbon and/or oxygen. Other additional or alternative elements are possible. In some embodiments, the transition metal layer may comprise significant proportions of other elements than transition metal. However, in some embodiments, transition metal layer may contain substantially only transition metal. Thus, transition metal layer may comprise, consist essentially of, or consist of transition metal. In some embodiments, the transition metal layer may be a seed layer. A seed layer may be used to enhance the deposition of another layer.

In some embodiments, a transition metal layer may comprise, for example, about 60 to about 99 atomic percentage (at. %) transition metal, or about 75 to about 99 at. % transition metal, or about 75 to about 95 at. % transition metal, or about 75 to about 89 at. % transition metal. A transition metal layer deposited by a method according to the current disclosure may comprise, for example about 80 at. %, about 83 at. %, about 85 at. %, about 87 at. %, about 90 at. %, about 95 at. %, about 97 at. % or about 99 at. % transition metal. In some embodiments, a transition metal layer may consist essentially of, or consist of transition metal. In some embodiments, transition metal layer may consist essentially of, or consist of transition metal. Layer consisting of transition metal may include an acceptable amount of impurities, such as oxygen, carbon, chlorine or other halogen, and/or hydrogen that may originate from one or more precursors used to deposit the transition metal layer.

In some embodiments, the transition metal layer may comprise less than about 30 at. %, less than about 20 at. %, less than about 10 at. %, less than about 8 at. %, less than about 7 at. %, less than about 5 at. %, or less than about 2 at. % oxygen. In some embodiments, the transition metal layer may comprise less than about 20 at. %, less than about 15 at. %, less than about 10 at. %, less than about 8 at. %, less than about 6 at. %, less than about 5 at. %, less than 4.5 at. %, or less than about 3 at. % carbon.

The substrate may be any underlying material or materials that can be used to form, or upon which, a structure, a device, a circuit, or a layer can be formed. A substrate can include a bulk material, such as silicon (e.g., single-crystal silicon), other Group IV materials, such as germanium, or other semiconductor materials, such as a Group II-VI or Group III-V semiconductor materials, and can include one or more layers overlying or underlying the bulk material. Further, the substrate can include various features, such as recesses, protrusions, and the like formed within or on at least a portion of a layer of the substrate. For example, a substrate can include bulk semiconductor material and an insulating or dielectric material layer overlying at least a portion of the bulk semiconductor material. Substrate may include nitrides, for example TiN, oxides, insulating materials, dielectric materials, conductive materials, metals, such as such as tungsten, ruthenium, molybdenum, cobalt, aluminum or copper, or metallic materials, crystalline materials, epitaxial, heteroepitaxial, and/or single crystal materials. In some embodiments of the current disclosure, the substrate comprises silicon. The substrate may comprise other materials, as described above, in addition to silicon. The other materials may form layers.

The method of depositing transition metal according to the current disclosure comprises providing a substrate in a reaction chamber. In other words, a substrate is brought into space where the deposition conditions can be controlled. The reaction chamber may be part of a cluster tool in which different processes are performed to form an integrated circuit. In some embodiments, the reaction chamber may be a flow-type reactor, such as a cross-flow reactor. In some embodiments, the reaction chamber may be a showerhead reactor. In some embodiments, the reaction chamber may be a space-divided reactor. In some embodiments, the reaction chamber may be single wafer ALD reactor. In some embodiments, the reaction chamber may be a high-volume manufacturing single wafer ALD reactor. In some embodiments, the reaction chamber may be a batch reactor for manufacturing multiple substrates simultaneously.

In the method according to the current disclosure, the transition metal precursor may be in vapor phase when it is in a reaction chamber. The transition metal precursor may be partially gaseous or liquid, or even solid at some points in time prior to being provided in the reaction chamber. In other words, a transition metal precursor may be solid, liquid or gaseous, for example, in a precursor vessel or other receptacle before delivery in a reaction chamber. Various means of bringing the precursor in to gas phase can be applied when delivery into the reaction chamber is performed. Such means may include, for example, heaters, vaporizers, gas flow or applying lowered pressure, or any combination thereof. Thus, the method according to the current disclosure may comprise heating the transition metal precursor prior to providing it to the reaction chamber. In some embodiments, transition metal precursor is heated to at least 60° C., to at least 100° C., or to at least 110° C., or to at least 120° C. or to at least 130° C. or to at least 140° C. in the vessel. In some embodiments, the transition metal precursor is heated to at most 160° C., or to at most 140° C., or to at most 120°, or to at most 100° C., or to at most 80° C., or to at most 60° C. Also the injector system may be heated to improve the vapor phase delivery of the transition metal precursor to the reaction chamber.

In this disclosure, "gas" can include material that is a gas at normal temperature and pressure (NTP), a vaporized solid and/or a vaporized liquid, and can be constituted by a single gas or a mixture of gases, depending on the context. Transition metal precursor may be provided to the reaction chamber in gas phase. The term "inert gas" can refer to a gas that does not take part in a chemical reaction and/or does not become a part of a layer to an appreciable extent. Exemplary inert gases include He and Ar and any combination thereof. In some cases, molecular nitrogen and/or hydrogen can be an inert gas. A gas other than a process gas, i.e., a gas introduced without passing through a precursor injector system, other gas distribution device, or the like, can be used for, e.g., sealing the reaction space, and can include a seal gas.

In the method according to the current disclosure, the reactant may be contacted with the substrate comprising a chemisorbed transition metal precursor. The conversion of a transition metal precursor to transition metal may take place at the substrate surface. In some embodiments, the conversion may take place at least partially in the gas phase.

In the current disclosure, the deposition process may comprise a cyclical deposition process, such as an atomic layer deposition (ALD) process or a cyclical chemical vapor deposition (VCD) process. The term "cyclical deposition process" can refer to the sequential introduction of precursor(s) and/or reactant(s) into a reaction chamber to deposit material, such as transition metal, on a substrate. Cyclic deposition includes processing techniques such as atomic layer deposition (ALD), cyclical chemical vapor deposition (cyclical CVD), and hybrid cyclical deposition processes that include an ALD component and a cyclical CVD component. The process may comprise a purge step between providing precursors or between providing a precursor and a reactant in the reaction chamber.

The process may comprise one or more cyclical phases. For example, pulsing of transition metal and reactant may be repeated. In some embodiments, the process comprises or one or more acyclical phases. In some embodiments, the deposition process comprises the continuous flow of at least one precursor. In some embodiments, a reactant may be continuously provided in the reaction chamber. In such an embodiment, the process comprises a continuous flow of a reactant.

The term "atomic layer deposition" (ALD) can refer to a vapor deposition process in which deposition cycles, such as a plurality of consecutive deposition cycles, are conducted in a reaction chamber. The term atomic layer deposition, as used herein, is also meant to include processes designated by related terms, such as chemical vapor atomic layer deposition, when performed with alternating pulses of precursor(s)/reactant(s), and optional purge gas(es). Generally, for ALD processes, during each cycle, a precursor is introduced to a reaction chamber and is chemisorbed to a deposition surface (e.g., a substrate surface that may include a previously deposited material from a previous ALD cycle or other material), forming about a monolayer or sub-monolayer of material that does not readily react with additional precursor (i.e., a self-limiting reaction). Thereafter, in some cases, a reactant (e.g., another precursor or a reaction gas) may subsequently be introduced into the process chamber for use in converting the chemisorbed precursor to the desired material on the deposition surface. The reactant can be capable of further reaction with the precursor. Purging steps may be utilized during one or more cycles, e.g., during each step of each cycle, to remove any excess precursor from the process chamber and/or remove any excess reactant and/or reaction byproducts from the reaction chamber.

CVD type processes typically involve gas phase reactions between two or more reactants. The precursor(s) and reactant(s) can be provided simultaneously to the reaction space or substrate, or in partially or completely separated pulses. The substrate and/or reaction space can be heated to promote the reaction between the gaseous reactants. In some embodiments the precursor(s) and reactant(s) are provided until a layer having a desired thickness is deposited. In some embodiments, cyclical CVD processes can be used with multiple cycles to deposit a thin film having a desired thickness. In cyclical CVD processes, the reactants may be provided to the reaction chamber in pulses that do not overlap, or that partially or completely overlap.

In some embodiments, transition metal precursor, reactant or both are provided to the reaction chamber in pulses. In some embodiments, the transition metal precursor is supplied in pulses, reactant supplied in pulses and the reaction chamber is purged between consecutive pulses of transition metal precursor and reactant. A duration of providing reactant or transition metal precursor into the reaction chamber (i.e. reactant or transition metal precursor pulse time, respectively) may be, for example, from about 0.01 s to about 60 s, for example from about 0.01 s to about 5 s, or from about 1 s to about 20 s, or from about 0.5 s to about 10 s, or from about 5 s to about 15 s, or from about 10 s to about 30 s, or from about 10 s to about 60 s, or from about 20 s to about 60 s. The duration of a transition metal precursor or a reactant pulse may be, for example 0.03 s, 0.1 s, 0.5 s, 1 s, 1.5 s, 2 s, 2.5 s, 3 s, 4 s, 5 s, 8 s, 10 s, 12 s, 15 s, 25 s, 30 s, 40 s, 50 s or 60 s. In some embodiments, transition metal precursor pulse time may be at least 5 seconds, or at least 10 seconds, or at least 20 seconds, or at least 30 seconds. In some embodiments, transition metal precursor pulse time may be at most 5 seconds, or at most 10 seconds or at most 20 seconds, or at most 30 seconds. In some embodiments, reactant pulse time may be at least 15 seconds, or at least 30 seconds, or at least 45 seconds, or at least 60 seconds. In some embodiments, reactant pulse time may be at most 15 seconds, or at most 30 seconds or at most 45 seconds, or at most 60 seconds.

The pulse times for transition metal precursor and reactant vary independently according to process in question. The selection of an appropriate pulse time may depend on the substrate topology. For higher aspect ratio structures, longer pulse times may be needed to obtain sufficient surface saturation in different areas of a high aspect ratio structure. Also the selected transition metal precursor and reactant chemistries may influence suitable pulsing times. For process optimization purposes, shorter pulse times might be preferred as long as appropriate layer properties can be achieved. In some embodiments, transition metal precursor pulse time is longer than reactant pulse time. In some embodiments, reactant pulse time is longer than transition metal precursor pulse time. In some embodiments, transition metal precursor pulse time is same as reactant pulse time.

In some embodiments, providing a reactant or a transition metal precursor to the reaction chamber comprises pulsing the reactant or transition metal precursor over a substrate. In certain embodiments, pulse times in the range of several minutes may be used for transition metal precursor and/or reactant. In some embodiments, transition metal precursor may be pulsed more than one time, for example two, three or four times, before a reactant is pulsed to the reaction chamber. Similarly, there may be more than one pulse, such as two, three or four pulses, of a reactant before transition metal precursor is pulsed (i.e. provided) to the reaction chamber.

A flow rate of the transition metal precursor or the reactant (i.e. transition metal precursor or reactant flow rate, respectively) may vary from about 5 sccm to about 20 slm. During providing a transition metal precursor or a reactant to the reaction chamber, a flow rate of the transition metal precursor or reactant may be less than 3,000 sccm, or less than 2,000 sccm, or less than 1,000 sccm, or less than 500 sccm, or less than 100 sccm. A transition metal precursor or reactant flow rate may be, for example, form 500 sccm 1200 sccm, such as 600 sccm, 800 sccm or 1000 sccm. In some embodiments, a flow rate of the transition metal precursor or the reactant to the reaction chamber is between 50 sccm and 3,000 sccm, or between 50 sccm and 2,000 sccm, or between 50 sccm and 1,000 sccm. In some embodiments, a flow rate of the transition metal precursor or the reactant to the reaction chamber is between 50 sccm and 900 sccm, or between 50 sccm and 800 sccm or between 50 sccm and 500 sccm. In some embodiments, higher flow rates may be utilized. For example, a transition metal precursor or a reactant flow rate may be 5 slm or higher. In some embodiments, a transition metal precursor or reactant flow rate may be 10 slm, 12 slm or 15 slm or 20 slm.

In some embodiments, the method comprises removing excess transition metal precursor from the reaction chamber by an inert gas prior to providing the reactant in the reaction chamber. In some embodiments, the reaction chamber is purged between providing a transition metal precursor in a reaction chamber and providing a reactant in the reaction chamber. In some embodiments, there is a purge step between every pulse. Thus, the reaction chamber may be purged also between two pulses of the same chemistry, such as a transition metal precursor or a reactant.

As used herein, the term "purge" may refer to a procedure in which vapor phase precursors and/or vapor phase byproducts are removed from the substrate surface for example by evacuating the reaction chamber with a vacuum pump and/or by replacing the gas inside a reaction chamber with an inert or substantially inert gas such as argon or nitrogen. Purging may be effected between two pulses of gases which react with each other. However, purging may be effected between two pulses of gases that do not react with each other. For example, a purge, or purging may be provided between pulses of two precursors or between a precursor and a reactant. Purging may avoid or at least reduce gas-phase interactions between the two gases reacting with each other. It shall be understood that a purge can be effected either in time or in space, or both. For example in the case of temporal purges, a purge step can be used e.g. in the temporal sequence of providing a first precursor to a reactor chamber, providing a purge gas to the reactor chamber, and providing a second precursor to the reactor chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied. Purging times may be, for example, from about 0.01 seconds to about 20 seconds, from about 0.05 s to about 20 s, or from about 1 s to about 20 s, or from about 0.5 s to about 10 s, or between about 1 s and about 7 seconds, such as 5 s, 6 s or 8 s. However, other purge times can be utilized if necessary, such as where highly conformal step coverage over extremely high aspect ratio structures or other structures with complex surface morphology is needed, or in specific reactor types, such as a batch reactor, may be used.

In some embodiments, the method according to the current disclosure comprises a thermal deposition process. In thermal deposition, the chemical reactions are promoted by increased temperature relevant to ambient temperature. Generally, temperature increase provides the energy needed for the formation of transition metal in the absence of other external energy sources, such as plasma, radicals, or other forms of radiation. In some embodiments, the method according to the current disclosure is a plasma-enhanced deposition method, for example PEALD or PECVD.

In some embodiments, transition metal may be deposited at a temperature from about 20° C. to about 800° C. For example, transition metal may be deposited at a temperature from about 20° C. to about 450° C., or at a temperature from about 50° C. to about 450° C., or at a temperature from about 150° C. to about 450° C., or at a temperature from about 450° C. to about 800° C. In some embodiments of the current disclosure, transition metal may be deposited at a temperature from about 20° C. to about 300° C., or at a temperature from about 300° C. to about 600° C. In some embodiments, transition metal may be deposited at a temperature from about 50° C. to about 150° C., or at a temperature from about 250° C. to about 400° C., or at a temperature from about 500° C. to about 700° C. For example, transition metal may be deposited at a temperature of about 75° C. or about 125° C. or about 175° C., or about 225° C., or about 200° C., or about 325° C. or about 375° C., or about 550° C., or about 650° C., or about 750° C.

A pressure in a reaction chamber may be selected independently for different process steps. In some embodiments, a first pressure may be used during transition metal precursor pulse, and a second pressure may be used during reactant pulse. A third or a further pressure may be used during purging or other process steps. In some embodiments, a pressure within the reaction chamber during the deposition process is less than 760 Torr, or wherein a pressure within the reaction chamber during the deposition process is between 0.1 Torr and 760 Torr, or between 1 Torr and 100 Torr, or between 1 Torr and 10 Torr. In some embodiments, a pressure within the reaction chamber during the deposition process is less than about 0.001 Torr, less than 0.01 Torr, less than 0.1 Torr, less than 1 Torr, less than 10 Torr, less than 50 Torr, less than 100 Torr or less than 300 Torr. In some embodiments, a pressure within the reaction chamber during at least a part of the method according to the current disclosure is less than about 0.001 Torr, less than 0.01 Torr, less than 0.1 Torr, less than 1 Torr, less than 10 Torr or less than 50 Torr, less than 100 Torr or less than 300 Torr. For example, in some embodiments, a first pressure may be about 0.1 Torr, about 0.5 Torr, about 1 Torr, about 5 Torr, about 10 Torr, about 20 Torr or about 50 Torr. In some embodiments, a second pressure is about 0.1 Torr, about 0.5 Torr, about 1 Torr, about 5 Torr, about 10 Torr, about 20 Torr or about 50 Torr.

The disclosure is further explained by the following exemplary embodiments depicted in the drawings. The illustrations presented herein are not meant to be actual views of any particular material, structure, or device, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure. The structures and devices depicted in the drawings may contain additional elements and details, which may be omitted for clarity.

Figure 1B:
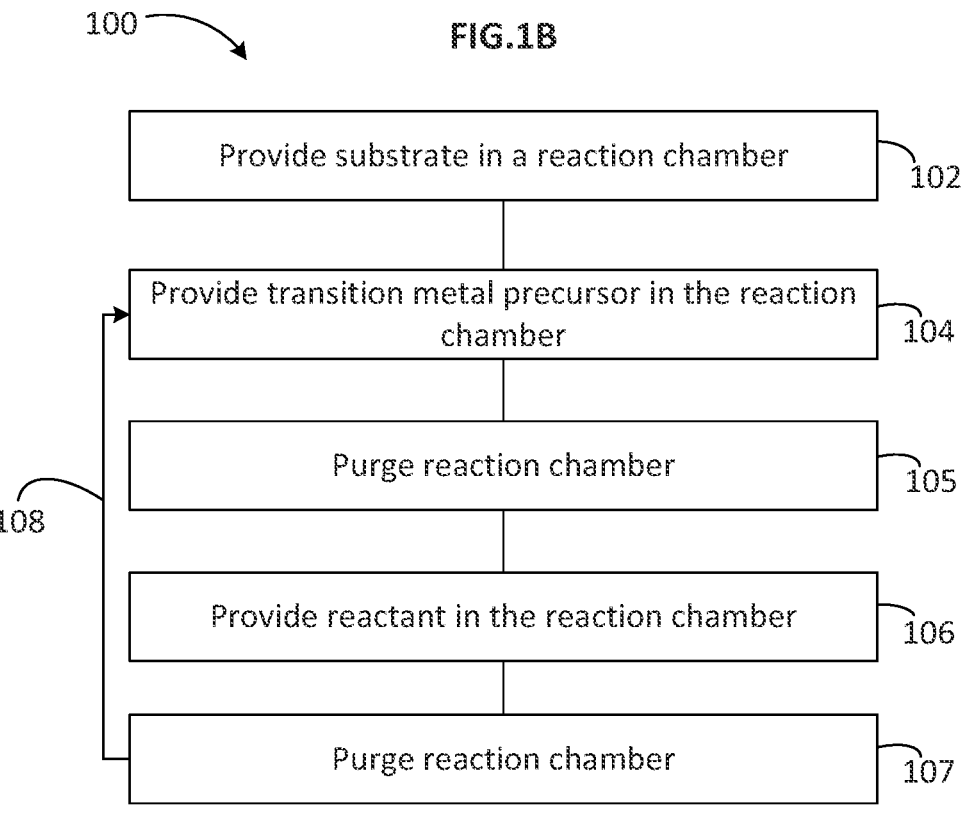

FIGS. 1A and 1B illustrate an exemplary embodiment of a method 100 according to the current disclosure. Method 100 may be used to form a layer comprising transition metal, i.e. a transition metal layer. The transition metal layer can be used during a formation of a structure or a device, such as a structure or a device described herein. However, unless otherwise noted, methods are not limited to such applications.

During step 102, a substrate is provided into a reaction chamber of a reactor. The reaction chamber can form part of an atomic layer deposition (ALD) reactor. The reactor may be a single wafer reactor. Alternatively, the reactor may be a batch reactor. Various phases of method 100 can be performed within a single reaction chamber or they can be performed in multiple reactor chambers, such as reaction chambers of a cluster tool. In some embodiments, the method 100 is performed in a single reaction chamber of a cluster tool, but other, preceding or subsequent, manufacturing steps of the structure or device are performed in additional reaction chambers of the same cluster tool. Optionally, a reactor including the reaction chamber can be provided with a heater to activate the reactions by elevating the temperature of one or more of the substrate and/or the reactants and/or precursors.

During step 102, the substrate can be brought to a desired temperature and pressure for providing transition metal precursor in the reaction chamber 104 and/or for providing reactant in the reaction chamber 106. A temperature (e.g. of a substrate or a substrate support) within a reaction chamber can be, for example, from about 50° C. to about 350° C., from about 150° C. to about 400° C., from about 200° C. to about 350° C. or from about 500° C. to about 750° C. As a further example, a temperature within a reaction chamber can be from about 275° C. to about 325° C., or from about 450° C. to about 600° C. Exemplary temperatures within the reaction chamber may be 100° C., 250° C., 300° C., 550° C., 650° C. or 700° C.

A pressure within the reaction chamber can be less than 760 Torr, for example 400 Torr, 100 Torr, 50 Torr or 20 Torr, 5 Torr, Torr or 0.1 Torr. Different pressure may be used for different process steps.

Transition metal precursor is provided in the reaction chamber containing the substrate 104. Without limiting the current disclosure to any specific theory, transition metal precursor may chemisorb on the substrate during providing transition metal precursor in the reaction chamber. The duration of providing transition metal precursor in the reaction chamber (transition metal precursor pulse time) may be, for example, 0.01 s, 0.5 s, 1 s, 1.5 s, 2 s, 4 s, 10 s, 20 s, 35 s, 50 s or 60 s. In some embodiments, the duration of providing transition metal precursor in the reaction chamber (transition metal precursor pulse time) is may be longer than 5 s or longer than 10 s or longer than 30 s. Alternatively, transition metal purge time may be shorter than 60 s, shorter than 30 s, shorter than 10 s, shorter than 4 s, shorter than 1 s., or shorter than 0.5 s.

When reactant is provided in the reaction chamber 106, it may react with the chemisorbed transition metal precursor, or its derivate species, to form transition metal. The duration of providing reactant in the reaction chamber (reactant pulse time) may be, for example 0.01 s, 0.2 s, 0.5 s, 1 s, 3 s, 4 s, 5 s, 7 s, 10 s, 11 s, 15 s, 25 s, 30 s, 45 s or 60 s. In some embodiments, the duration of providing reactant in the reaction chamber is be shorter than 60 s, shorter than 40 s, shorter than 20 s, shorter than 10 s, shorter than 4 s or about 3 s. Conversely, in some embodiments, a minimum duration for the reactant pulse may be defined. For example, the reactant pulse time may be shorter than 60 s, shorter than 40 s, shorter than 25 s, shorter than 15 s, shorter than 8 s, shorter than 5 s, or shorter than 2 s.

In some embodiments, transition metal precursor may be heated before providing it into the reaction chamber. In some embodiments, reactant may be heated before providing it to the reaction chamber. In some embodiments, the reactant may kept in ambient temperature before providing it to the reaction chamber.

Stages 104 and 106, performed in any order, may form a deposition cycle, resulting in the deposition of transition metal. In some embodiments, the two stages of transition metal deposition, namely providing the transition metal precursor and the reactant in the reaction chamber (104 and 106), may be repeated (loop 108). Such embodiments contain several deposition cycles. The thickness of the deposited transition metal may be regulating by adjusting the number of deposition cycles. The deposition cycle (loop 108) may be repeated until a desired transition metal thickness is achieved. For example about 50, 100, 200, 300, 400, 500, 700, 800, 1,000, 1,200, 1,500 or 2,000 deposition cycles may be performed.

The amount of transition metal deposited during one cycle (growth per cycle) varies depending on the process conditions, and may be, for example, from about 0.01 Å/cycle to about 6 Å/cycle, or from about 0.1 Å/cycle to about 5 Å/cycle, 0.3 Å/cycle to about 4.5 Å/cycle, such as from about 0.5 Å/cycle to about 3.5 Å/cycle or from about 1.2 Å/cycle to about 3.0 Å/cycle. For example, the growth rate may be about 1.0 Å/cycle, 1.2 Å/cycle, 1.4. A/cycle, 1.6 Å/cycle, 1.8 Å/cycle, 2 Å/cycle, 2.2 Å/cycle, 2.4 Å/cycle. In some embodiments, growth rate of the transition metal layer may be lower, such as from about 0.01 Å/cycle to about 2 Å/cycle, or from about 0.1 Å/cycle to about 2 Å/cycle, whereas in some other embodiments, the growth rate may be higher, for example from about 0.5 Å/cycle to about 2 Å/cycle, from about 1 Å/cycle to about 2.5 Å/cycle, or from about 2 Å/cycle to about 6 Å/cycle, Depending on the deposition conditions, deposition cycle numbers etc., transition metal layers of variable thickness may be deposited. For example, transition metal or transition metal-containing layer may have a thickness between approximately 0.2 nm and 60 nm, or between about 1 nm and 50 nm, or between about 0.5 nm and 25 nm, or between about 1 nm and 50 nm, or between about 10 nm and 60 nm. A transition metal layer may have a thickness of, for example, approximately 0.2 nm, 0.3 nm, 0.5 nm, 1 nm, 1.5 nm, 2 nm, 2.5 nm, 3 nm, 3.5 nm, 4 nm, 4.5 nm, 5 nm, 6 nm, 8 nm, 10 nm, 15 nm, 20 nm, 25 nm, 30 nm, 35 nm, 40 nm, 50 nm, 70 nm, 85 nm or 100 nm. The desired thickness may be selected according to the application in question.

Transition metal precursor and reactant may be provided in the reaction chamber in separate steps (104 and 106). FIG. 1B illustrates an embodiment according to the current disclosure, where steps 104 and 106 are separate by purge steps 105 and 107. In such embodiments, a deposition cycle comprises one or more purge steps 103, 105. During purge steps, precursor and/or reactant can be temporally separated from each other by inert gases, such as argon (Ar), nitrogen (N$_2$) or helium (He) and/or a vacuum pressure. The separation of transition metal precursor and reactant may alternatively be spatial.

Purging the reaction chamber 103, 105 may prevent or mitigate gas-phase reactions between a transition metal precursor and a reactant, and enable possible self-saturating surface reactions. Surplus chemicals and reaction byproducts, if any, may be removed from the substrate surface, such as by purging the reaction chamber or by moving the substrate, before the substrate is contacted with the next reactive chemical. In some embodiments, however, the substrate may be moved to separately contact a transition metal precursor and a reactant. Because in some embodiments, the reactions may self-saturate, strict temperature control of the substrates and precise dosage control of the precursors may not be required. However, the substrate temperature is preferably such that an incident gas species does not condense into monolayers or multimonolayers nor thermally decompose on the surface.

When performing the method 100, transition metal is deposited onto the substrate. The deposition process may be a cyclical deposition process, and may include cyclical CVD, ALD, or a hybrid cyclical CVD/ALD process. For example, in some embodiments, the growth rate of a particular ALD process may be low compared with a CVD process. One approach to increase the growth rate may be that of operating at a higher deposition temperature than that typically employed in an ALD process, resulting in some portion of a chemical vapor deposition process, but still taking advantage of the sequential introduction of a transition metal precursor and a reactant. Such a process may be referred to as cyclical CVD. In some embodiments, a cyclical CVD process may comprise the introduction of two or more precursors into the reaction chamber, wherein there may be a time period of overlap between the two or more precursors in the reaction chamber resulting in both an ALD component of the deposition and a CVD component of the deposition. This is referred to as a hybrid process. In accordance with further examples, a cyclical deposition process may comprise the continuous flow of one reactant or precursor and the periodic pulsing of the other chemical component into the reaction chamber. The temperature and/or pressure within a reaction chamber during step 104 can be the same or similar to any of the pressures and temperatures noted above in connection with step 102.

In some embodiments, the transition metal precursor is brought into contact with a substrate surface 104, excess transition metal precursor is partially or substantially completely removed by an inert gas or vacuum 105, and reactant is brought into contact with the substrate surface comprising transition metal precursor. Transition metal precursor may be brought in to contact with the substrate surface in one or more pulses 104. In other words, pulsing of the transition metal precursor 104 may be repeated. The transition metal precursor on the substrate surface may react with the reactant to form transition metal on the substrate surface. Also pulsing of the reactant 106 may be repeated. In some embodiments, reactant may be provided in the reaction chamber first 106. Thereafter, the reaction chamber may be purged 105 and transition metal precursor provided in the reaction chamber in one or more pulses 104.

In some embodiments, transition metal layer according to the current disclosure may have a resistivity of from about 5 $\mu\Omega$ cm to about 300 $\mu\Omega$ cm. For example, the resistivity of a transition metal layer according to the current disclosure may be 10 $\mu\Omega$ cm, 15 $\mu\Omega$ cm, 20 $\mu\Omega$ cm, 50 $\mu\Omega$ cm, 100 $\mu\Omega$ cm, 150 $\mu\Omega$ cm or 200 $\mu\Omega$ cm. The thickness of a layer with said resistivity may be, for example, 10 nm, 20 nm, 30 nm, 40 nm, 50 nm or 60 nm.

In some embodiments, the thickness non-uniformity of the deposited transition metal layer is less than about 3%.

Resistivity of a transition metal layer may be reduced by using a post-deposition anneal. Annealing may be performed directly after deposition a transition metal layer, i.e. without additional layers being deposited. Alternatively, annealing may be performed after additional layers have been deposited. A transition metal layer may be capped before annealing. A capping layer may comprise, consist essentially of, or consist of silicon nitride. An annealing temperature from about 320° C. to about 500° C. could be used. For example, an annealing temperature may be 330° C., 350° C., 380° C., 400° C., 430° C. or 450° C. or 470° C. Annealing may be performed in a gas atmosphere comprising, consist essentially of, or consist of argon, argon-hydrogen mixture, hydrogen, nitrogen or nitrogen-hydrogen mixture. Duration of annealing may be from about 1 minute to about 60 minutes, for example 5 minutes, 20 minutes, 30 minutes or 45 minutes. An annealing may be performed at a pressure of 0.05 to 760 Torr. For example, a pressure during annealing may be about 1 Torr, about 10 Torr, about 100 Torr or about 500 Torr.

In a non-limiting example, a transition metal, such as a molybdenum, layer may be deposited at a pressure of at least 5 Torr, such as at a pressure of about 6 Torr, 7 Torr or 8 Torr. Using a pressure between 5 Torr and 10 Torr may lead to an advantageous growth rate of the transition metal. In some embodiments, the growth rate of the transition metal may be, for example about 2 Å/cycle or about 3 Å/cycle. A pressure between 5 Torr and 10 Torr may decrease the thickness non-uniformity of the deposited material by, for example from about 60% to 90% relative to low-pressure deposition (i.e to deposition pressure below 3 Torr). Further, the incubation time before the initiation of transition metal layer growth may be reduced. In the exemplary embodiment, the transition metal precursor is $Mo(EtBz)_2$ and the reactant comprises a dihaloalkane, such as a diiodoethane.

Figures 2, 3:
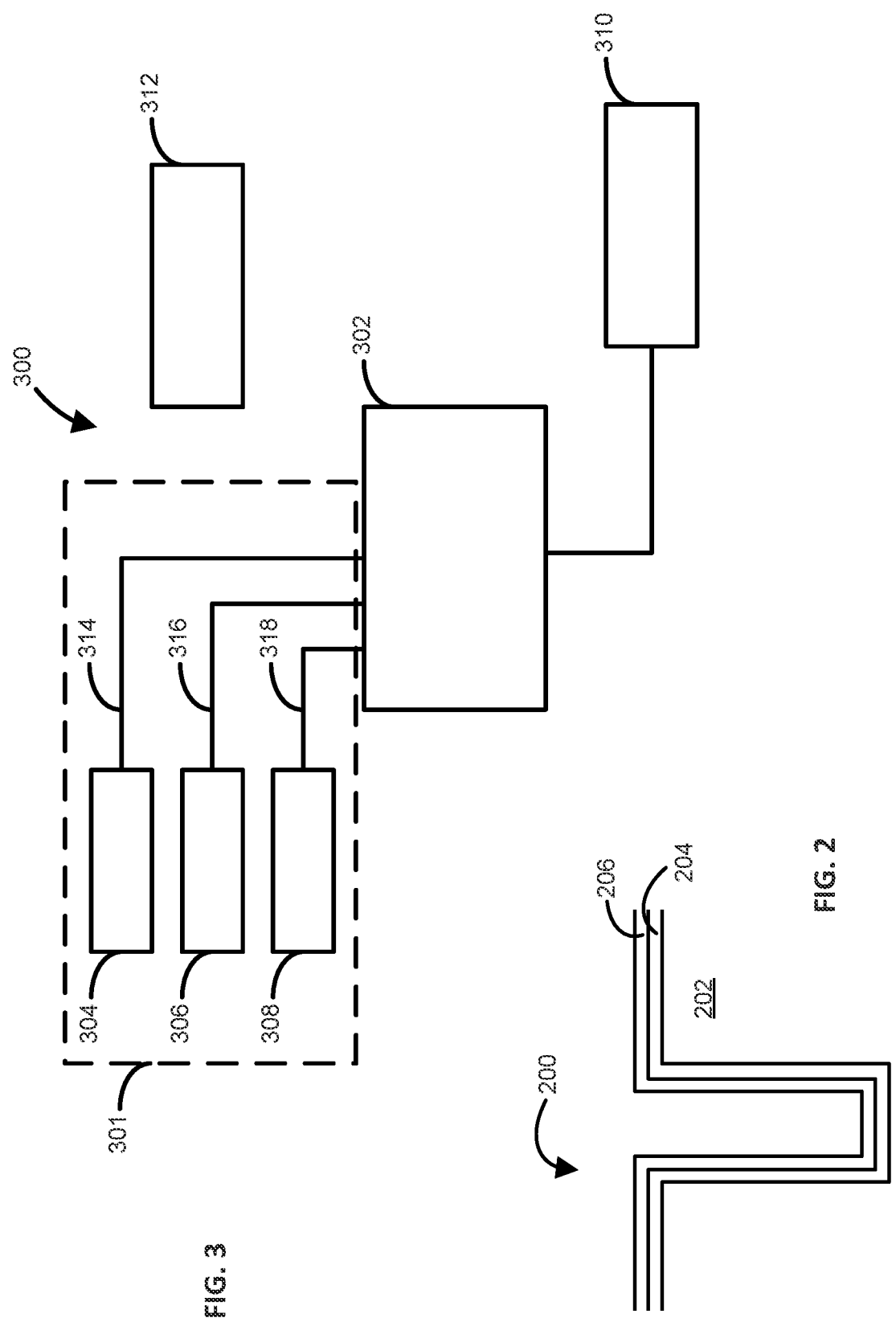
FIG. 2 depicts an exemplary structure comprising a transition metal layer according to the current disclosure.
FIG. 3 presents a deposition apparatus according to the current disclosure in a schematic manner.

FIG. 2 illustrates an exemplary structure, or a portion of a device 200 in accordance with the disclosure. Portion of a device or structure 200 includes a substrate 202, a transition metal layer 204, and an optional underlayer 206 in between (e.g., in contact with one or both) substrate 202 and transition metal layer 204. Substrate 202 can be or include any of the substrate material described herein, such as a dielectric or insulating layer. By way of example, dielectric or insulating layer can be high-k material, such as, for example, a metallic oxide. In some embodiments, the high-k material has a dielectric constant higher than the dielectric constant of silicon oxide. Exemplary high-k materials include one or more of hafnium oxide ($HfO_2$), tantalum oxide ($Ta_2O_5$), zirconium oxide ($ZrO_2$), titanium oxide ($TiO_2$), hafnium silicate (HfSiOx), aluminum oxide ($Al_2O_3$), lanthanum oxide ($La_2O_3$), titanium nitride, and mixtures/laminates comprising one or more such layers. Alternatively, substrate material may comprise metal.

Transition metal layer 204 can be formed according to a method described herein. In embodiments in which an underlayer 206, is formed, the underlayer 206 may be formed using a cyclical deposition process. In some embodiments, transition metal layer 204 can comprise predominantly, such as at least 50 at. %, at least 70 at. %, at least 90 at. % or at least 95 at. %, elemental transition metal. In some embodiments, a transition metal layer may be deposited directly on the substrate. In such embodiments, there is no underlayer. As a further alternative, the structure or a device according to the current disclosure may comprise more than one layer between substrate and transition metal layer.

FIG. 3 illustrates a deposition assembly 300 according to the current disclosure in a schematic manner. Deposition assembly 300 can be used to perform a method as described herein and/or to form a structure or a device, or a portion thereof as described herein.

In the illustrated example, deposition assembly 300 includes one or more reaction chambers 302, a precursor injector system 301, a transition metal precursor vessel 304, reactant vessel 306, a purge gas source 308, an exhaust source 310, and a controller 312.

Reaction chamber 302 can include any suitable reaction chamber, such as an ALD or CVD reaction chamber.

The transition metal precursor vessel 304 can include a vessel and one or more transition metal precursors as described herein—alone or mixed with one or more carrier (e.g., inert) gases. Reactant vessel 306 can include a vessel and one or more reactants as described herein—alone or mixed with one or more carrier gases. Purge gas source 308 can include one or more inert gases as described herein. Although illustrated with three source vessels 304-308, deposition assembly 300 can include any suitable number of source vessels. Source vessels 304-308 can be coupled to reaction chamber 302 via lines 314-318, which can each include flow controllers, valves, heaters, and the like. In some embodiments, the transition metal precursor in the precursor vessel may be heated. In some embodiments, the vessel is heated so that the transition metal precursor reaches a temperature between about 30° C. and about 160° C., such as between about 100° C. and about 145° C., for example 85° C., 100° C., 110° C., 120° C., 130° C. or 140° C.

Exhaust source 310 can include one or more vacuum pumps.

Controller 312 includes electronic circuitry and software to selectively operate valves, manifolds, heaters, pumps and other components included in the deposition assembly 300. Such circuitry and components operate to introduce precursors, reactants and purge gases from the respective sources 304-308. Controller 312 can control timing of gas pulse sequences, temperature of the substrate and/or reaction chamber 302, pressure within the reaction chamber 302, and various other operations to provide proper operation of the deposition assembly 300. Controller 312 can include control software to electrically or pneumatically control valves to control flow of precursors, reactants and purge gases into and out of the reaction chamber 302. Controller 312 can include modules such as a software or hardware component, which performs certain tasks. A module may be configured to reside on the addressable storage medium of the control system and be configured to execute one or more processes.

Other configurations of deposition assembly 300 are possible, including different numbers and kinds of precursor and reactant sources and purge gas sources. Further, it will be appreciated that there are many arrangements of valves, conduits, precursor sources, and purge gas sources that may be used to accomplish the goal of selectively and in coordinated manner feeding gases into reaction chamber 302. Further, as a schematic representation of an deposition assembly, many components have been omitted for simplicity of illustration, and such components may include, for example, various valves, manifolds, purifiers, heaters, containers, vents, and/or bypasses.

During operation of deposition assembly 300, substrates, such as semiconductor wafers (not illustrated), are transferred from, e.g., a substrate handling system to reaction chamber 302. Once substrate(s) are transferred to reaction chamber 302, one or more gases from gas sources 304-308, such as precursors, reactants, carrier gases, and/or purge gases, are introduced into reaction chamber 302.

Figure 4:
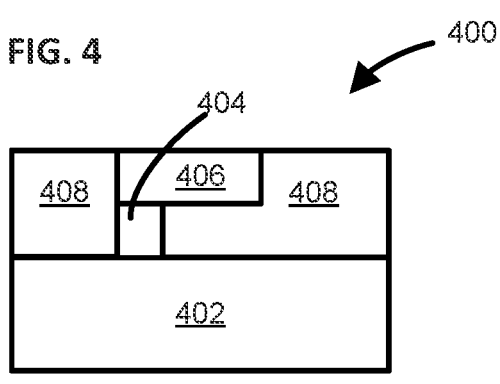
FIG. 4 depicts an exemplary device comprising transition metal deposited according to the current disclosure.

FIG. 4 illustrates a line 406 and a via 404 in a semiconductor device 400. The device is positioned on a semiconductor substrate 402. The substrate 402 may contain any of the substrate material described in the current disclosure. Additional functional layers (not depicted in the figure) may be present on the substrate 402. A via 404 is in contact with the substrate and a line 406. The via 404 may comprise, consist essentially of, or consist of transition metal deposited according to the current disclosure. The line 406 may comprise consist essentially of, or consist of transition metal deposited according to the current disclosure, or it may comprise, consist essentially of, or consist of another metal such as copper. The via 404 and the line 406 are surrounded by low k material.

Figure 5:
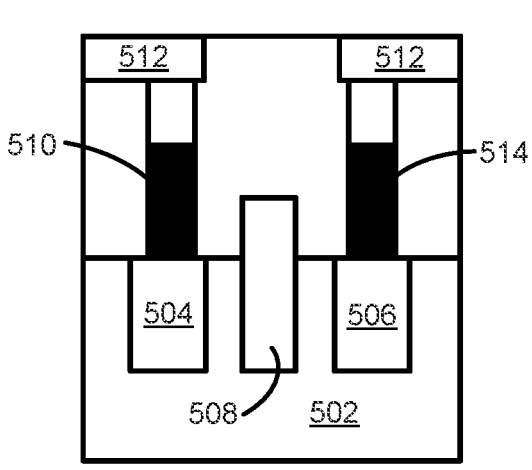
FIG. 5, panels A to D depicts devices comprising transition metal deposited according to the current disclosure.
Figure 5:
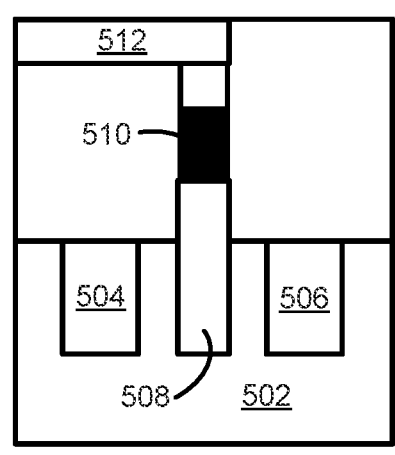
Figure 5:
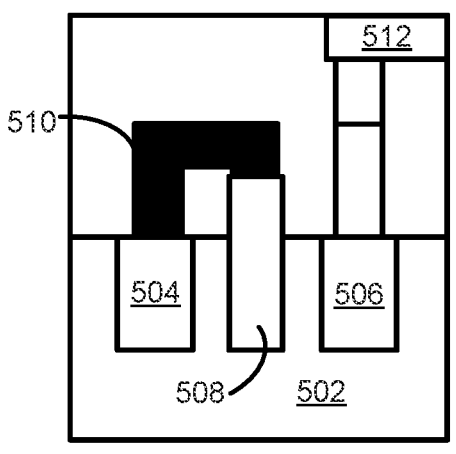
Figure 5:
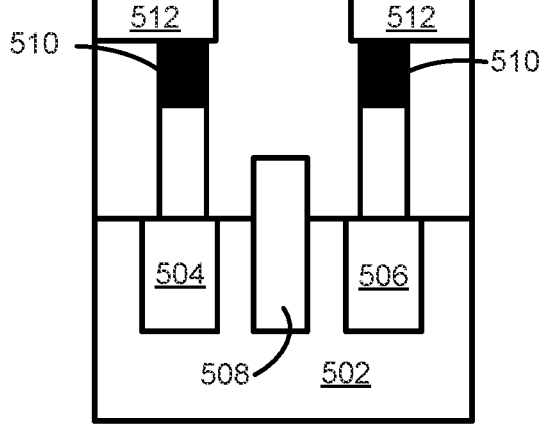

FIG. 5, panels A to D, exemplifies transition metal deposited according to the current disclosure in different contact applications. In all panels, substrate is indicated with the numeral 502, source with numeral 504, drain with numeral 506, gate with numeral 508 and a contact with numeral 512. In panel A, transition metal deposited according to the current disclosure is used in a source contact 510 and a drain contact 514. In panel B, transition metal deposited according to the current disclosure is used in a gate contact 510, and in panel C, in a local interconnect 510 between a gate 508 and a source 504. In panel D, transition metal is used in a connect 510 between a via and a contact 512. In all the described examples, the structure in which transition metal according to the current disclosure is used, may comprise, consist essentially of, or consist of said transition metal.

Figure 6:
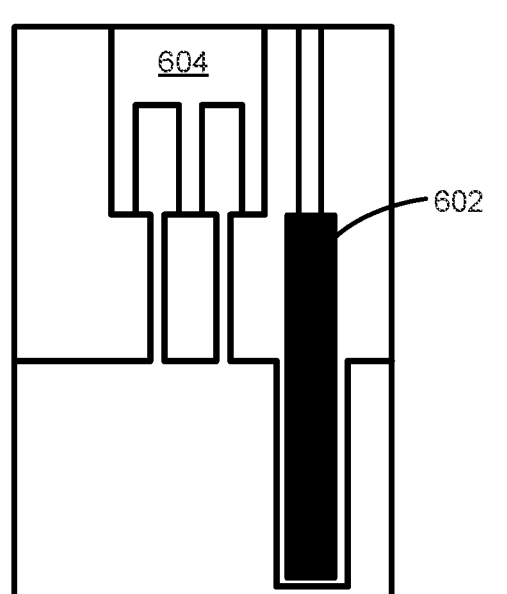
FIG. 6 is a representation of a buried power rail comprising transition metal deposited according to the current disclosure.

FIG. 6 depicts buried power rail 602 comprising transition metal deposited according to the current disclosure, and a FinFET structure 604.

Figure 7:
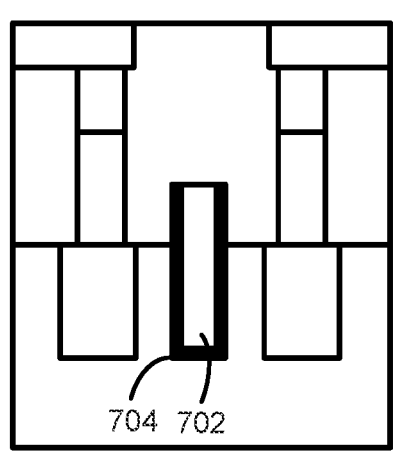
FIG. 7 depicts a device comprising a work function layer comprising transition metal deposited according to the current disclosure.

FIG. 7 illustrates a gate 702, in which a work function layer 704 comprises, consist essentially of, or consist of transition metal deposited according to the current disclosure in a similar device as depicted in FIG. 5.

Figure 8:
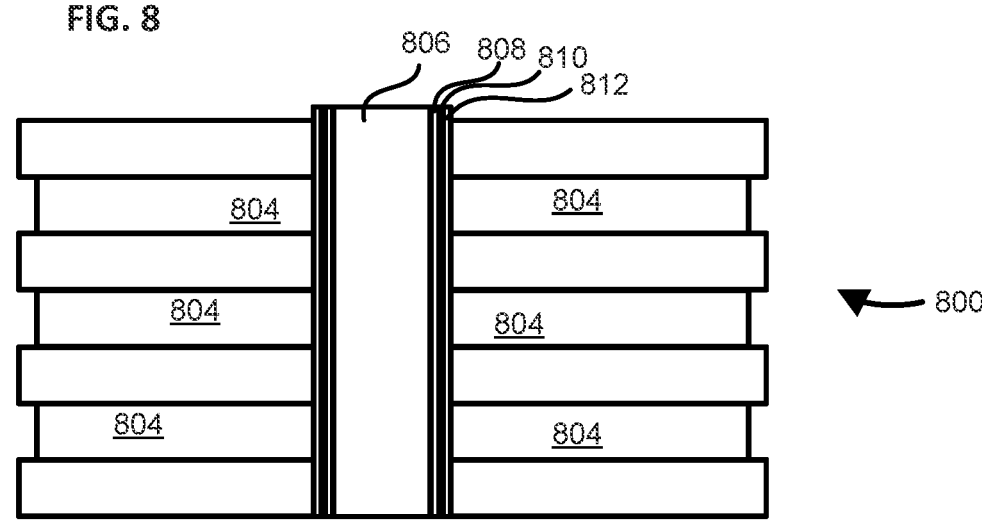
FIG. 8 illustrates word lines in a 3D NAND comprising transition metal deposited according to the current disclosure.

FIG. 8 is an illustration of a 3D NAND 800 in which wordline 804 comprises, consist essentially of, or consist of transition metal deposited according to the current disclosure. The figure displays exemplary embodiments of a channel 806, tunnel oxide 808, a charge trap layer 810 and a blocking oxide 812 for reference.

Figure 9:
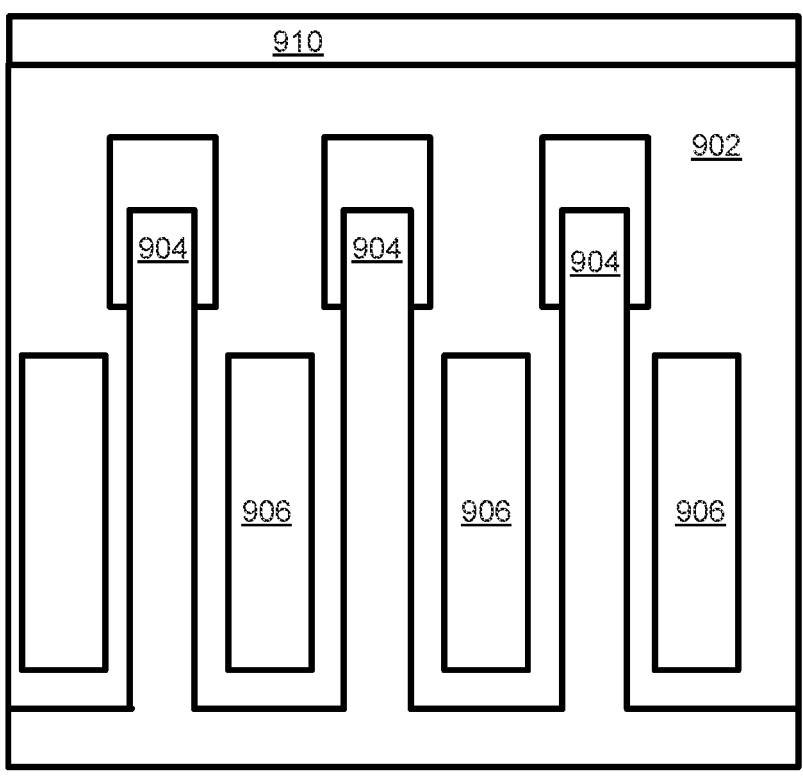
FIG. 9 displays an exemplary embodiment of word lines in a DRAM comprising transition metal deposited according to the current disclosure.

FIG. 9 illustrates an exemplary embodiment of a DRAM 900 with buried wordline 906. In the figure, 902 indicates source, 904 gate and 910 a bitline. Buried wordline 906 comprises, consist essentially of, or consist of transition metal deposited according to the current disclosure.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of depositing a transition metal on a substrate by a cyclical deposition process, the method comprising:
    providing a substrate in a reaction chamber;
    providing a transition metal precursor to the reaction chamber in a vapor phase; and
    providing a reactant to the reaction chamber in a vapor phase to form the transition metal on the substrate; wherein:
    the transition metal precursor comprises titanium, zirconium, hafnium, vanadium, niobium, tantalum, chromium, or molybdenum,
    the reactant comprises a group 14 element, and
    at least 60% of the transition metal is deposited as elemental metal, and
    the reactant has a general formula RaMXb or RcXdM-MRcXd, wherein a is 0-3, b is 4-a, c is 0, 1 or 2, d is 3-c, R is hydrocarbon, M is Ge or Sn, and each X is independently any ligand.

2. The method according to claim 1, wherein the reactant comprises silicon.

3. The method according to claim 1, wherein the reactant comprises carbon.

4. The method according to claim 1, wherein the transition metal comprises molybdenum.

5. The method according to claim 1, wherein the transition metal precursor comprises a metal-organic precursor.

6. The method according to claim 5, wherein the transition metal precursor comprises an additional ligand.

7. The method according to claim 6, wherein the additional ligand is a halide.

8. The method according to claim 1, wherein the transition metal precursor comprises a benzene or a cyclopentadienyl group.

9. The method according to claim 1, wherein the reactant comprises an organic group.

10. The method according to claim 1, wherein R is an alkyl or an aryl.

11. The method according to claim 1, wherein X is hydrogen, a substituted or an unsubstituted alkyl, a substituted or an unsubstituted aryl, or a halogen.

12. The method according to claim 11, wherein X is a substituted alkyl or the substituted aryl, and wherein the substituent is same as M.

13. The method according to claim 1, wherein the transition metal precursor is supplied in pulses, the reactant is supplied in pulses, and the reaction chamber is purged between consecutive pulses of the transition metal precursor and reactant.

14. The method according to claim 1, wherein the pressure in the reaction chamber is between 0.1 and 100 Torr.

15. The method according to claim 1, wherein the cyclical deposition process comprises a thermal deposition process.

16. The method according to claim 1, wherein the substrate comprises a dielectric surface and the transition metal is deposited on the dielectric surface.

17. The method according to claim 1, wherein the transition metal is a group 4 or a group 5 metal.

* * * * *